(12) United States Patent
Gambino et al.

(10) Patent No.: US 8,729,664 B2
(45) Date of Patent: May 20, 2014

(54) DISCONTINUOUS GUARD RING

(75) Inventors: Jeffrey P. Gambino, Westford, VT (US); Mark D. Jaffe, Shelburne, VT (US); Mark D. Levy, Milton, VT (US); John C. Malinowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/437,273

(22) Filed: Apr. 2, 2012

(65) Prior Publication Data

US 2013/0256826 A1    Oct. 3, 2013

(51) Int. Cl.
H01L 29/15 (2006.01)
H01L 23/52 (2006.01)
H01L 29/47 (2006.01)
H01L 27/095 (2006.01)

(52) U.S. Cl.
USPC .......................................................... 257/531

(58) Field of Classification Search
USPC ................... 257/452, 484, 620, E21.526, 777, 257/E27.144, E23.169, E23.178, E21.503, 257/E21.511, 181, 203, 688
See application file for complete search history.

(56) References Cited

U.S. PATENT DOCUMENTS

| | | | |
|---|---|---|---|
| 5,266,831 A | 11/1993 | Phipps et al. | |
| 5,834,829 A | 11/1998 | Dinkel et al. | |
| 6,261,945 B1 | 7/2001 | Nye, III et al. | |
| 6,455,910 B1 * | 9/2002 | Wang | 257/484 |
| 6,734,567 B2 | 5/2004 | Chiu et al. | |
| 7,109,093 B2 | 9/2006 | Fitzsimmons et al. | |
| 7,235,864 B2 | 6/2007 | Lee | |
| 7,382,039 B2 | 6/2008 | Hollenbeck et al. | |
| 7,790,577 B2 | 9/2010 | Liu et al. | |
| 8,004,066 B2 | 8/2011 | Kim et al. | |
| 2002/0145196 A1 | 10/2002 | Wang | |
| 2002/0167071 A1 | 11/2002 | Wang | |
| 2008/0099884 A1 | 5/2008 | Inohara | |
| 2009/0146252 A1 * | 6/2009 | Huang et al. | 257/531 |
| 2010/0200958 A1 | 8/2010 | Angyal et al. | |

OTHER PUBLICATIONS

Chen et al., "Investigation on seal-ring rules for IC product reliability in 0.25-μm CMOS technology," Microelectronics Reliability, vol. 45, 2005, pp. 1311-1316, © 2005 Elsevier Ltd. doi:10.1016/j.microrel.2005.07.012.
Bronckers, Stephane. "Substrate Noise Coupling in Analog/RF Systems," Jun. 2009, pp. i-xiii, 1-237, [petinent pages: Chapter 3 entitled "Passive Isolation Structures," pp. 35-71], © 2009 Stephane Bronckers, Uitgeverij VUBPRESS Brussels University Press, Brussels, ISBN 9789054875932.

* cited by examiner

*Primary Examiner* — Steven Loke
*Assistant Examiner* — Mouloucoulaye Inoussa
(74) *Attorney, Agent, or Firm* — Nicholas L. Cadmus

(57) ABSTRACT

An integrated circuit chip comprising a guard ring formed on a semiconductor substrate that surrounds the active region of the integrated circuit chip and extends from the semiconductor substrate through one or more of a plurality of wiring levels. The guard ring comprises stacked metal lines with spaces breaking up each respective metal line. Each space may be formed such that it partially overlies the space in the metal line directly below but does not overlie any other space. Alternatively, each space may also be formed such that each space is at least completely overlying the space in the metal line below it.

9 Claims, 5 Drawing Sheets

DISCONTINUOUS GUARD RING

TECHNICAL FIELD

The present invention relates generally to integrated circuit chips, and more specifically to discontinuous guard ring structures to prevent the propagation of cracks into the active region of integrated circuit chips.

BACKGROUND

Guard rings are structures fabricated along the perimeter of an integrated circuit chip to prevent delamination of the various layers of the integrated circuit chip and other edge damage during "dicing" of individual integrated circuit chips from a wafer on which multiple integrated circuit chips have been fabricated. Wafers are flat, thin (typically less than one millimeter (0.04 inch) thick), large in diameter (typically being up to 300 mm (about 12 inches)), and relatively brittle.

At a final stage of fabrication, the wafer is cut or diced into individual integrated circuit chips, either by sawing or by scribing and breaking. During the cutting or dicing process, the wafer is subjected to high shear stresses which can cause cracks to form that extend inwardly from the edges of each chip. Due to the stresses encountered when dicing the chip, or even later during use, cracks can propagate inward from the edges of the chip and eventually reach the active portion of the chip, damaging semiconductor devices disposed in the active portion.

Guard rings are typically in the form of a metallic ring-like structure positioned between the active region of the chip and the edge of the chip so as to encompass the active region of the chip. Generally, the active region of the chip is an internal circuit region containing semiconductor devices. Cracks that extend inwardly from the edges of a chip are halted by the guard ring. The guard ring typically extends vertically upward from a semiconductor device layer of the chip through all of the back-end-of-line ("BEOL") metallization layers (also referred to herein as wiring levels) of the chip.

SUMMARY

Embodiments of the present invention disclose an integrated circuit chip comprising a semiconductor substrate, with one or more devices formed on the semiconductor substrate within an active region of the integrated circuit chip, and a plurality of wiring levels formed over the semiconductor substrate and the one or more devices. The integrated circuit chip also comprises a guard ring formed on the semiconductor substrate that surrounds the active region of the integrated circuit chip and extends from the semiconductor substrate through one or more of the plurality of wiring levels.

From one aspect of the present invention, the guard ring comprises a first metal line surrounding the active region, the first metal line having a space between a first portion of the first metal line and a second portion of the first metal line such that a continuous circuit is not formed around the active region. The guard ring also comprises a second metal line formed on top of the first metal line, the second metal line having a space between a first portion of the second metal line and a second portion of the second metal line such that a continuous circuit is not formed around the active region, wherein a portion of the space on the second metal line partially overlies the space on the first metal line. The guard ring also comprises a third metal line formed on top of the second metal line, the third metal line having a space between a first portion of the third metal line and a second portion of the third metal line such that a continuous circuit is not formed around the active region, wherein a portion of the space on the third metal line partially overlies the space on the second metal line, and wherein the space on the third metal line does not overlie the space on the first metal line.

From another aspect of the present invention, the guard ring comprises a plurality of metal lines, each respective metal line having a space between a first portion and a second portion, wherein each respective space between the first portion and the second portion is formed such that the respective space is at least completely overlying the space of an underlying metal line.

DETAILED DESCRIPTION

Figure 1:
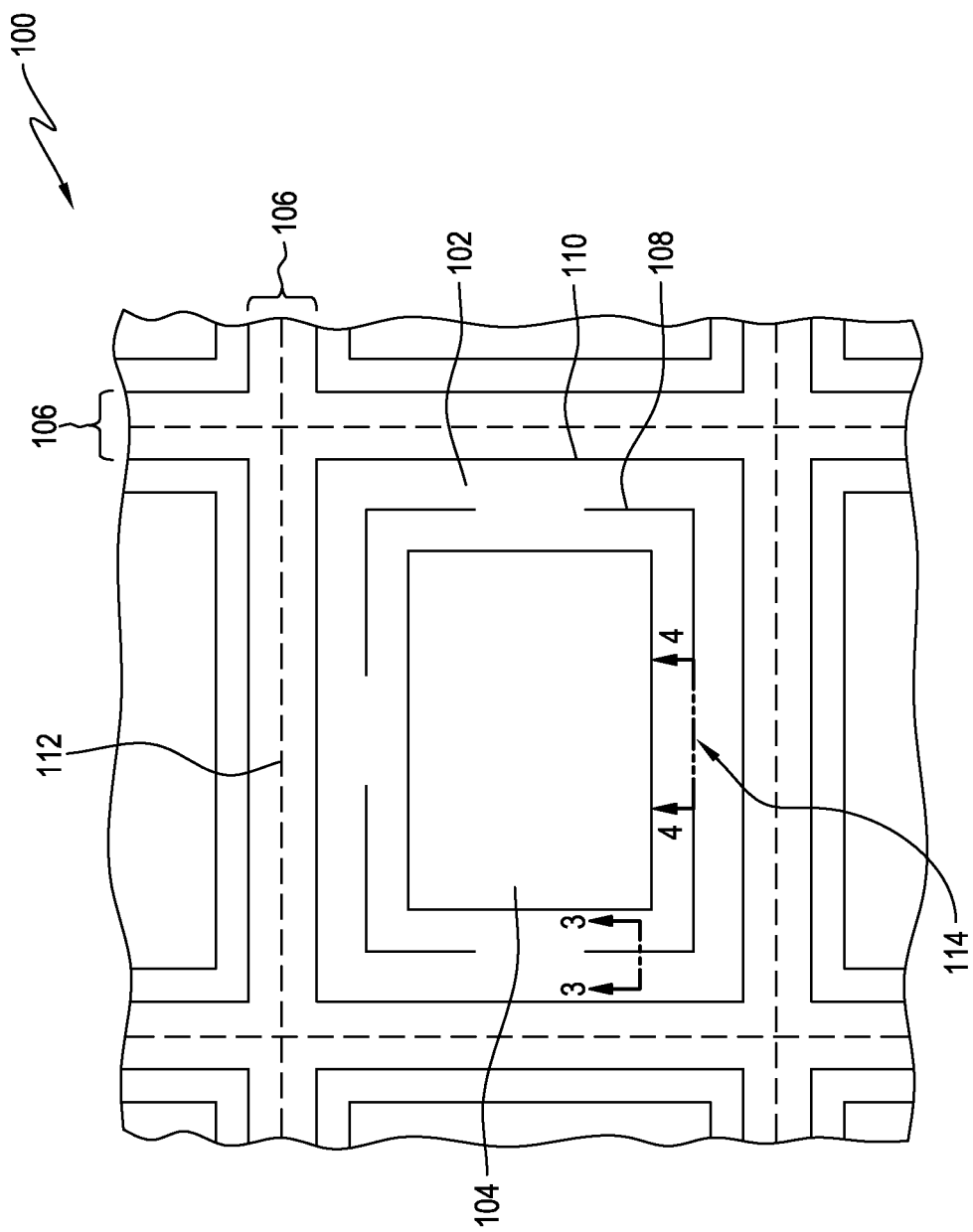
FIG. 1 depicts a plan view of integrated circuit chips prior to dicing in accordance with one embodiment of the present invention.

Detailed embodiments of the present invention are disclosed herein with reference to the accompanying drawings. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed present invention, as oriented in the drawing figures. The terms "overlying", "underlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present invention will now be described in detail with reference to the figures.

FIG. 1 depicts a plan view of integrated circuit chips on a wafer prior to dicing in accordance with one embodiment of the present invention. In FIG. 1, wafer 100 includes an array of integrated circuit chips. Integrated circuit chip 102 is separated from other integrated circuit chips by kerf regions 106. Active region 104 of each integrated circuit chip is surrounded by discontinuous guard ring 108. Generally, active region 104 of integrated circuit chip 102 is an internal circuit region containing semiconductor devices and wiring levels. Discontinuous guard ring 108 is a metallic structure positioned between active region 104 and edge 110 of integrated circuit chip 102 so as to encompass active region 104. Edge 110 indicates the edge of integrated circuit chip 102 after dicing along dashed lines 112. In other embodiments, other structures such as another guard ring or crack stop may be positioned between edge 110 and discontinuous guard ring 108 or between active region 104 and discontinuous guard ring 108.

Discontinuous guard ring 108 contains gap 114. Gap 114 is a region along discontinuous guard ring 108, as it extends around active region 104, where there is a space between a first portion of discontinuous guard ring 108 and a second portion of discontinuous guard ring 108 so that discontinuous guard ring 108 does not form a continuous structure around active region 104. Exemplary layouts of discontinuous guard ring 108 are discussed in reference to FIGS. 2A through 2D. Line 3 illustrates a cross-section of discontinuous guard ring 108 discussed in reference to FIG. 3. Line 4 illustrates a cross-section of gap 114 in discontinuous guard ring 108. Alternate embodiments of gap 114, depicted at the cross-section of line 4, are discussed in reference to FIGS. 4 and 5.

Figure 2A:
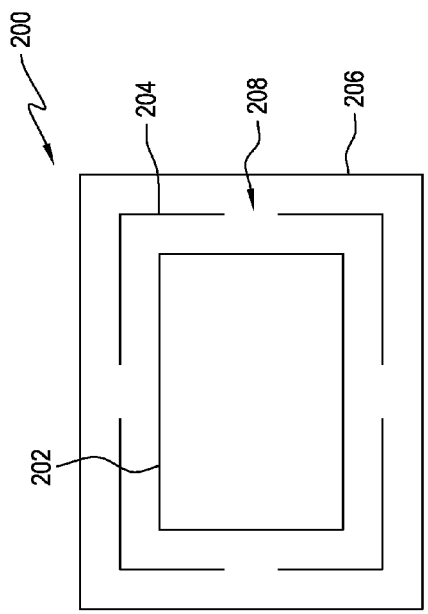
FIGS. 2A through 2D depict exemplary discontinuous guard ring layouts on an integrated circuit chip in accordance with multiple embodiments of the present invention.

FIGS. 2A through 2D depict exemplary discontinuous guard ring layouts on an integrated circuit chip, in accordance with multiple embodiments of the present invention. A discontinuous guard ring is a metallic structure positioned between an active region and an edge of an integrated circuit chip so as to encompass the active region. FIG. 2A depicts integrated circuit chip 200 containing discontinuous guard ring 204 positioned between active region 202 and edge 206. In one embodiment, discontinuous guard ring 204 runs substantially parallel to edge 206 of integrated circuit chip 200 so as to encompass active region 202. Discontinuous guard ring 204 is substantially rectangular and contains gap 208 positioned along a side of the rectangle. Gap 208 may be from about 1 um to about 50 um in length, more preferably from about 5 um to about 10 um. In other embodiments, gap 208 may be positioned anywhere along discontinuous guard ring 204.

Figure 2B:
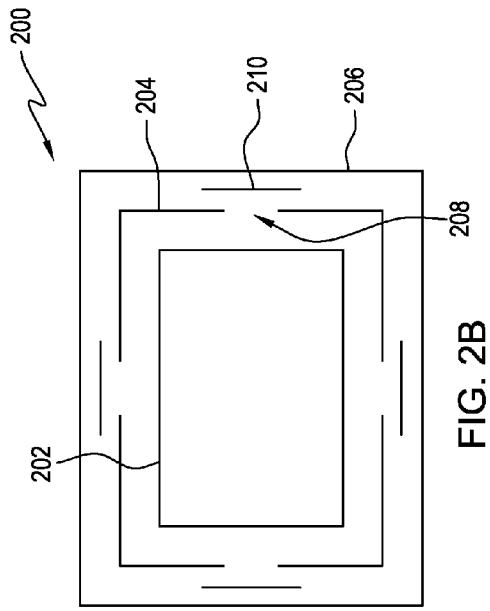

FIG. 2B depicts integrated circuit chip 200 as described in reference to FIG. 2A with the addition of outer shield structure 210. Outer shield structure 210 is a metallic structure positioned between edge 206 and gap 208 of discontinuous guard ring 204. In one embodiment, outer shield structure 210 extends substantially parallel to discontinuous guard ring 204. The distance between outer shield structure 210 and gap 208 of discontinuous guard ring 204 may be from about 2 um to 5 um. In a preferred embodiment, outer shield structure 210 is of a length at least the length of gap 208. More preferably, outer shield structure 210 is of a length and position such that the ends of outer shield structure 210 extend at least 10 um past the ends of gap 208.

Figure 2C:
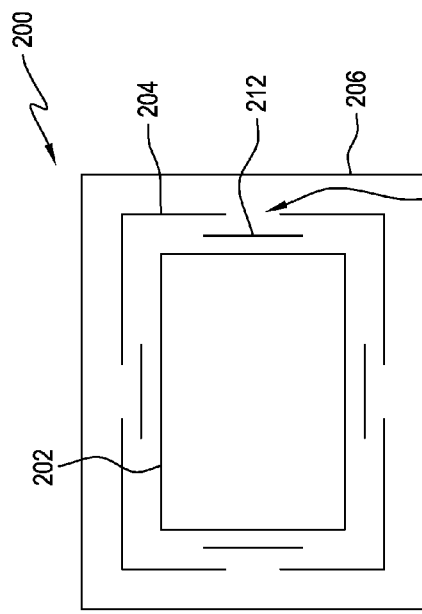

FIG. 2C depicts integrated circuit chip 200 as described in reference to FIG. 2A with the addition of inner shield structure 212. Inner shield structure 212 is a metallic structure positioned between gap 208 of discontinuous guard ring 204 and active region 202. In one embodiment, inner shield structure 212 extends substantially parallel to discontinuous guard ring 204. The distance between inner shield structure 212 and gap 208 of discontinuous guard ring 204 may be from about 2 um to 5 um. In a preferred embodiment, inner shield structure 212 is of a length at least the length of gap 208. More preferably, inner shield structure 212 is of a length and position such that the ends of inner shield structure 212 extend at least 10 um past the ends of gap 208.

Figure 2D:
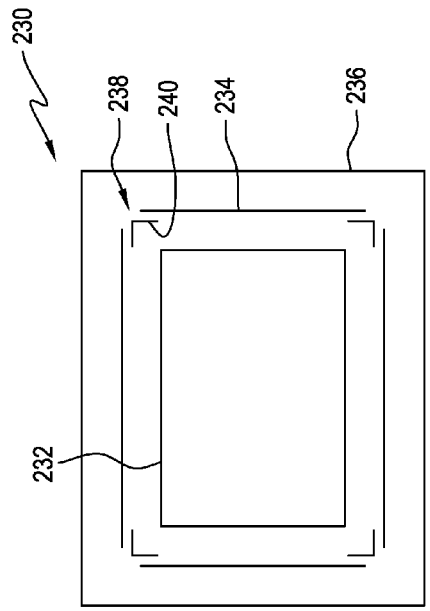

FIG. 2D depicts integrated circuit chip 230 containing discontinuous guard ring 234 positioned between active region 232 and edge 236. Discontinuous guard ring 234 runs substantially parallel to edge 236 of integrated circuit chip 230 so as to encompass active region 232. In one embodiment, discontinuous guard ring 234 is substantially rectangular and includes gap 238 positioned at the corner of discontinuous guard ring 234. Gap 238 may be from about 1 um to about 50 um in length. More preferably, from about 5 um to about 10 um. Gap 238 extends from the end of a first portion of discontinuous guard ring 234 to a corner of discontinuous guard ring 234 then to a second portion of discontinuous guard ring 234 from the corner.

In one embodiment, corner shield structure 240 is a metallic structure positioned between edge 236 and gap 238 of discontinuous guard ring 234. In one embodiment, corner shield structure 240 extends substantially parallel to discontinuous guard ring 234. The distance between corner shield structures 240 and gap 238 of discontinuous guard ring 234 may be from about 2 um to 5 um. In a preferred embodiment, corner shield structure 240 is of a length at least the length of gap 238. More preferably, corner shield structure 240 is of a length and position such that the ends of corner shield structure 240 extend at least 10 um past the ends of gap 238.

Figure 3:
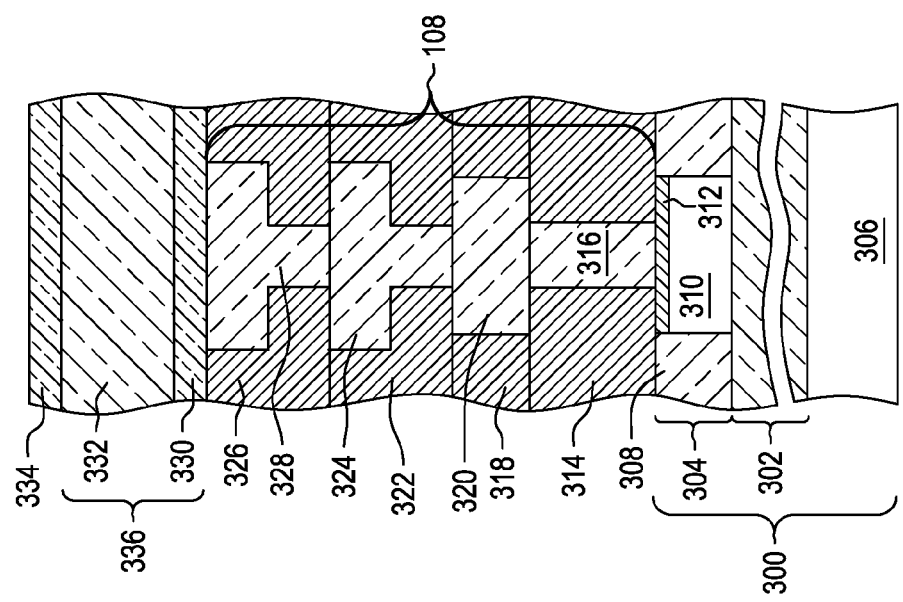
FIG. 3 depicts a sectional view through line 3 of FIG. 1 illustrating a cross-section of a discontinuous guard ring in accordance with one embodiment of the present invention.

FIG. 3 depicts a sectional view through line 3 of FIG. 1 illustrating a cross-section of discontinuous guard ring 108 in accordance with one embodiment of the present invention. Discontinuous guard ring 108 is a metallic structure that contains a plurality of layers extending from a semiconductor device layer through a plurality of wiring levels.

In FIG. 3, semiconductor substrate 300 includes buried oxide (BOX) layer 302 between semiconductor layer 304 and supporting substrate 306. In one embodiment, semiconductor layer 304 and supporting substrate 306 comprise silicon. As illustrated, semiconductor substrate 300 is an example of a silicon-on-insulator (SOI) substrate. In other embodiments, semiconductor substrates, such as bulk silicon substrates, silicon-germanium substrates, gallium arsenide (GaAs), indium phosphide (InP), or any other semiconductor substrate may be substituted for SOI substrates.

Regions of shallow trench isolation (STI) 308 have been formed in semiconductor substrate 300. Regions of doped monocrystalline silicon 310 are also present in semiconductor substrate 300. A contact layer 312 has been formed on the top surface of doped monocrystalline silicon 310. In one embodiment, contact layer 312 is a metal silicide. Formed on top of contact layer 312 and on top of STI 308 is first dielectric layer 314. In one embodiment, first dielectric layer 314 comprises dielectric material.

Dielectric material is an insulating material or a combination of insulating materials. Such materials may include, in a non-exhaustive list, silicon dioxide, silicon nitride, undoped or doped silicate glasses, such as borophosphosilicate glass (BPSG), fluorosilicate glass (FSG), and phosphosilicate glass (PSG), and low-k (dielectric constant) or ultra low-k dielectric materials, such as hydrogen silsesquioxane polymer (HSQ), methyl silsesquioxane polymer (MSQ), organosilicate glass (SiCOH), and porous SiCOH.

Contact 316 is formed through first dielectric layer 314. Contact 316 extends from the top of first dielectric layer 314 to the top of contact layer 312. The top of first dielectric layer 314 is essentially coplanar with the top of contact 316. First dielectric layer 314 and contact 316 comprise a contact level of the integrated circuit chip, which may also be considered a wiring level.

Second dielectric layer 318 is formed on top of first dielectric layer 314. Metal line 320 is formed through second dielectric layer 318. Metal line 320 extends from the top of second dielectric layer 318 to the top of contact 316. The top of metal line 320 is essentially coplanar with the top of second dielectric layer 318. In one embodiment, second dielectric layer 318 comprises dielectric material as discussed above. Second dielectric layer 318 and metal line 320 comprise a first wiring level (or a second wiring level if contact 316 is counted as a line) of the integrated circuit chip.

Third dielectric layer 322 is formed on top of second dielectric layer 318 and on top of metal wire 320. In one embodiment, third dielectric layer 322 comprises dielectric material as discussed above. Metal line 324 is formed through third dielectric layer 322. Metal line 324 extends from the top of third dielectric layer 322 to the top of metal line 320. The top of metal line 324 is essentially coplanar with the top of third dielectric layer 322. Third dielectric layer 322 and metal line 324 comprise a second wiring level (or a third wiring level if contact 316 is counted as a line) of the integrated circuit chip.

Fourth dielectric layer 326 is formed on top of third dielectric layer 322 and on top of metal line 324. In one embodiment, fourth dielectric layer 326 comprises dielectric material as discussed above. Metal line 328 is formed through fourth dielectric layer 326. Metal line 328 extends from the top of fourth dielectric layer 326 to the top of metal line 324. The top of metal line 328 is essentially coplanar with the top of fourth dielectric layer 326. Fourth dielectric layer 326 and metal line 328 comprise a third wiring level (or a fourth wiring level if contact 316 is counted as a line) and in this embodiment, the last wiring level of the integrated circuit chip. Additional wiring levels (not illustrated in the drawings) similar to the second and third wiring levels (if contact 316 is not counted as a line) may be formed between the first and second wiring levels.

Terminal passivation level 336 is formed on fourth dielectric layer 326. Terminal passivation level 336 comprises first terminal dielectric layer 330 and second terminal dielectric layer 332. Terminal passivation level 336 is optional in other embodiments. In one embodiment, first terminal dielectric layer 330 and second terminal dielectric layer 332 comprises dielectric material as discussed above. Chip passivation layer 334 is formed on top of terminal passivation level 336. Chip passivation layer 334 may comprise two or more layers. Chip passivation layer 334 may include an oxide layer, a silicon carbide layer, a polyimide layer or combination thereof.

In one embodiment, contact 316 and metal lines 320, 324 and 328 may be formed by a damascene process or any other etching and deposition process know in the art. Metal lines 320, 324 and 328 may be different shapes, for example, metal line 324 contains a wider portion of metal line 324 directly atop a narrower portion of metal line 324, as might be the result of a two-step etching process, and metal line 320 contains one wide portion. In one embodiment, contact 316 comprises tungsten. In one embodiment, metal lines 320, 324 and 328 comprise a core of copper, a liner of tantalum over the copper core and a liner of tantalum nitride over the tantalum liner.

In one embodiment, discontinuous guard ring 108 comprises contact 316, metal line 320, metal line 324 and metal line 328 extending from semiconductor layer 304 to metal line 328. The structure of outer shield structure 210, inner shield structure 212, and corner shield structure 240 as discussed in reference to FIGS. 2B through 2D may comprise a metallic structure similar to discontinuous guard ring 108 as described above or may comprise any other metallic structure that contains a plurality of layers extending from a semiconductor device layer through a plurality of wiring levels.

Figure 4:
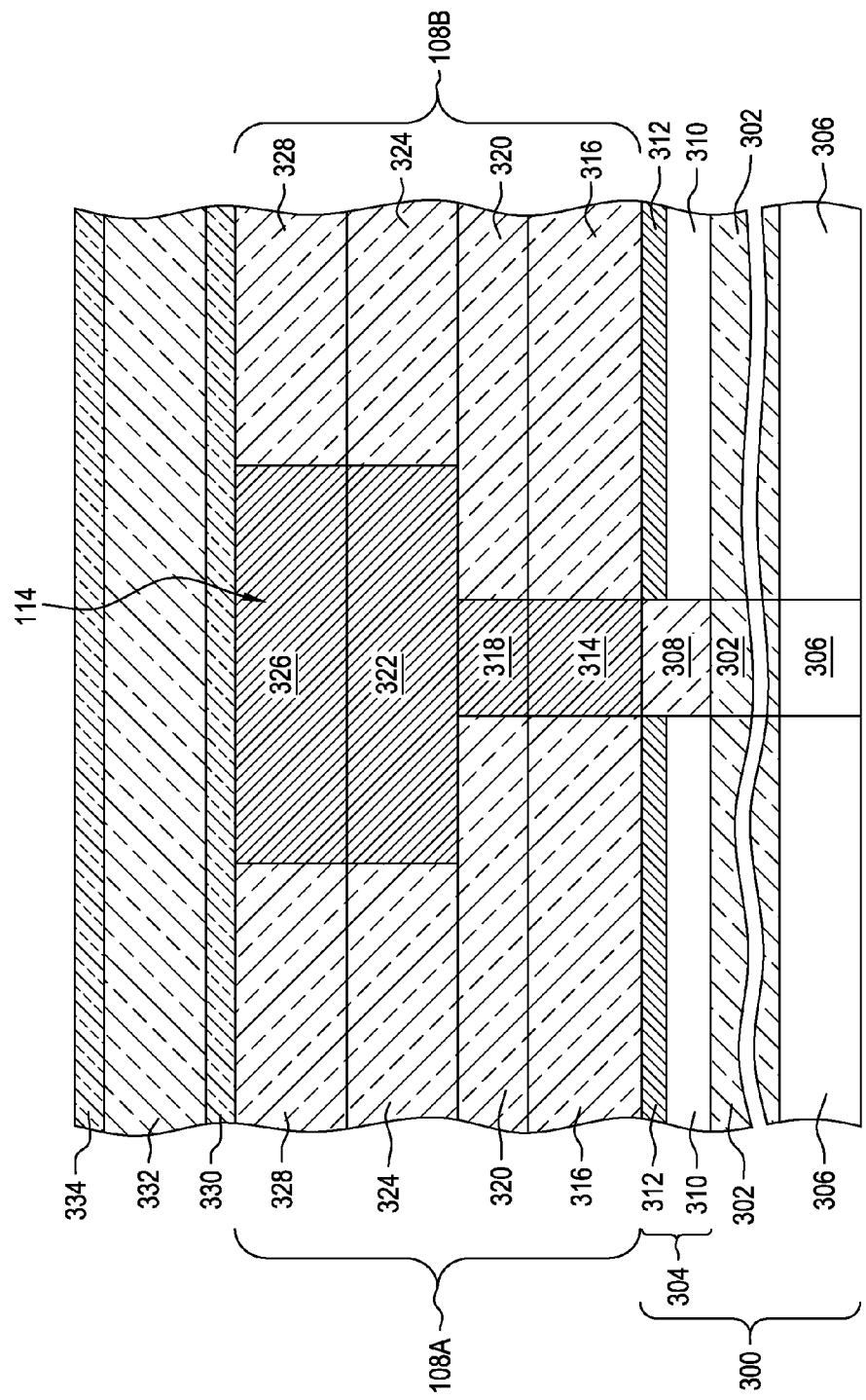
FIG. 4 depicts a sectional view through line 4 of FIG. 1 illustrating a cross-section of a gap in a discontinuous guard ring in accordance with one embodiment of the present invention.
Figure 5:
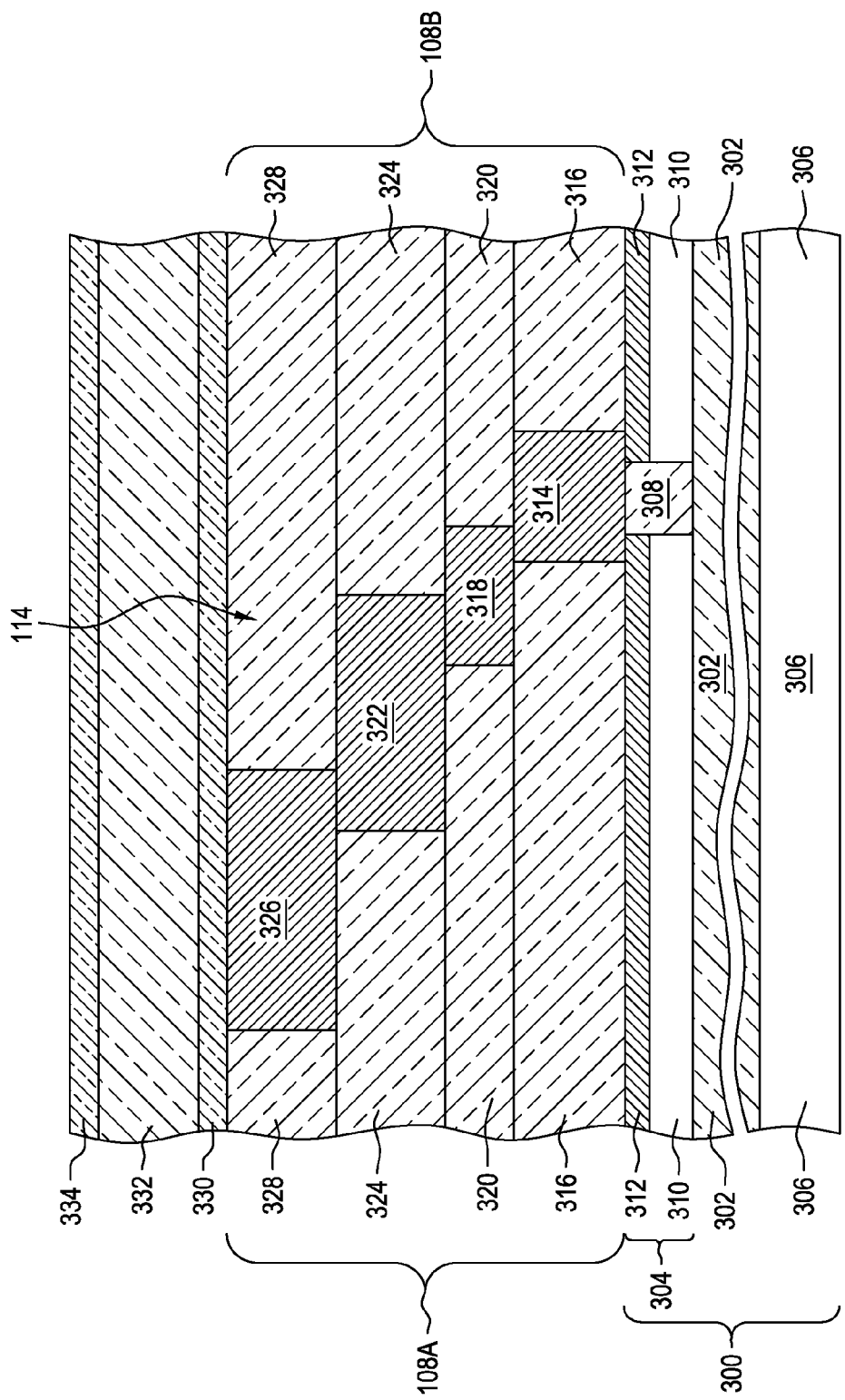
FIG. 5 depicts an alternate sectional view through line 4 of FIG. 1 illustrating a cross-section of a gap in a discontinuous guard ring in accordance with another embodiment of the present invention.

FIG. 4 and FIG. 5 depict alternative sectional views through line 4 of FIG. 1 illustrating a cross-section of a gap in a discontinuous guard ring in accordance with multiple embodiments of the present invention. Discontinuous guard ring 108 is a metallic structure that contains contact 316, metal line 320, metal line 324 and metal line 328 extending from semiconductor layer 304 to metal line 328 as described in reference to FIG. 3.

Discontinuous guard ring 108 contains gap 114. Gap 114 is a region along discontinuous guard ring 108, as it extends around an active region of an integrated circuit chip, where there is a space between first portion of discontinuous guard ring 108 (portion 108A) and a second portion of discontinuous guard ring 108 (portion 108B) so that discontinuous guard ring 108 does not form a continuous structure around the active region. The space between portion 108A and portion 108B may contain a separate space or gap breaking up each metal line of the plurality of metal lines in discontinuous guard ring 108. The plurality of spaces may be positioned in various configurations and have different dimensions.

Generally, the higher wiring levels (further from the semiconductor layer) have the thickest and widest metal lines and the lower wiring levels (closer to the semiconductor layer) have thin and narrow metal lines. In these examples, contact 316 and metal line 320 are considered to be in lower wiring levels and metal lines 324 and 328 are considered to be in higher wiring levels.

In FIG. 4, an example of gap 114 is depicted. In one embodiment, contact 316 was formed within dielectric layer 314 such that portion 108A of contact 316 is separated from portion 108B of contact 316. As such, a space between portions 108A and 108B contains dielectric material from the layer in which the metal line was formed. In the case of contact 316, the space comprises dielectric material from dielectric layer 314. Similarly, the space separating portions of metal line 320 contains dielectric material from dielectric layer 318; the space separating portions of metal line 324 contains dielectric material from dielectric layer 322; and the space separating portion of metal line 328 contains dielectric material from dielectric layer 326.

The length of the space separating contact 316 of first portion 108A from contact 316 of second portion 108B and the length of the space separating metal line 320 of first portion 108A from metal line 320 of second portion 108B each may be from about 0.1 um to about 1 um. The length of the space separating metal line 324 of first portion 108A from metal line 324 of second portion 108B and the length of the space separating metal line 328 of first portion 108A from metal line 328 of second portion 108B each may be from about 1 um to 10 um, preferably from about 2 um to 3 um.

In one embodiment, each respective space breaking up the stacked metal lines of discontinuous guard ring 108 to form gap 114, is formed such that the respective space is equal to or greater than the space directly below it, and each space completely overlies the space directly below it. In such an embodiment, the space breaking up metal line 320 is at least completely overlaying the space breaking up contact 316, the space breaking up metal line 324 is at least completely overlaying the space breaking up metal line 320, and the space breaking up metal line 328 is at least completely overlaying the space breaking up metal line 324.

In FIG. 5, an alternate example of gap 114 is depicted. In one embodiment, contact 316 was formed within dielectric layer 314 such that portion 108A of contact 316 is separated from portion 108B of contact 316. As such, a space between portions 108A and 108B contains dielectric material from the layer in which the metal line was formed. In the case of contact 316, the space comprises dielectric material from dielectric layer 314. Similarly, the space separating portions of metal line 320 contains dielectric material from dielectric layer 318; the space separating portions of metal line 324 contains dielectric material from dielectric layer 322; and the space separating portion of metal line 328 contains dielectric material from dielectric layer 326.

In one embodiment, each respective space breaking up the stacked metal lines of discontinuous guard ring 108 to form gap 114, is formed such that each space partially overlies the space directly below it, and each space does not overlie any other space but the space directly below it. In such an embodiment, a portion of the space breaking up metal line 320 is partially overlaying a portion of the space breaking up contact 316; a portion of the space breaking up metal line 324 is partially overlaying a portion of the space breaking up metal line 320 and the space breaking up metal line 324 does not overlie the space breaking up contact 316; and a portion of the space breaking up metal line 328 is partially overlaying a portion of the space breaking up metal line 324 and the space breaking up metal line 328 does not overlie the space breaking up metal line 320. This would continue for each subsequent metal line in the plurality of metal lines of discontinuous guard ring 108.

The integrated circuit chips comprising a discontinuous guard ring can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the present invention. As used herein, the singular forms "a", "an" and "the" are intended to include the plural forms as well, unless the context clearly indicates otherwise.

Having described embodiments of a discontinuous guard ring (which are intended to be illustrative and not limiting), it is noted that modifications and variations may be made by persons skilled in the art in light of the above teachings. It is therefore to be understood that changes may be made in the particular embodiments disclosed which are within the scope of the present invention as outlined by the appended claims.

What is claimed is:

1. An integrated circuit chip, comprising:
a semiconductor substrate, one or more devices formed on the semiconductor substrate within an active region of the integrated circuit chip, and a plurality of wiring levels formed over the semiconductor substrate and the one or more devices; and
a guard ring formed on the semiconductor substrate, wherein the guard ring surrounds the active region of the integrated circuit chip and extends from the semiconductor substrate through one or more of the plurality of wiring levels, the guard ring comprising:
stacked metal lines, with a space breaking up each respective metal line, positioned such that each space partially overlies the space in the metal line directly below but does not overlie any other space.

2. An integrated circuit chip, comprising:
a semiconductor substrate, one or more devices formed on the semiconductor substrate within an active region of the integrated circuit chip, and a plurality of wiring levels formed over the semiconductor substrate and the one or more devices;
a guard ring formed on the semiconductor substrate, wherein the guard ring surrounds the active region of the integrated circuit chip and extends from the semiconductor substrate through one or more of the plurality of wiring levels, the guard ring comprising:
a first metal line surrounding the active region, the first metal line having a space between a first portion of the first metal line and a second portion of the first metal line such that a continuous circuit is not formed around the active region;
a second metal line formed on top of the first metal line, the second metal line having a space between a first portion of the second metal line and a second portion of the second metal line such that a continuous circuit is not formed around the active region, wherein a portion of the space on the second metal line partially overlies the space on the first metal line; and
a third metal line formed on top of the second metal line, the third metal line having a space between a first portion of the third metal line and a second portion of the third metal line such that a continuous circuit is not formed around the active region, wherein a portion of the space on the third metal line partially overlies the space on the second metal line, and wherein the space on the third metal line does not overlie the space on the first metal line.

3. The integrated circuit chip of claim 2, wherein the respective spaces in the first, second and third metal lines, in addition to spaces in any additional metal lines in the guard ring, together comprise a gap in the guard ring such that the guard ring does not form a continuous circuit around the active region, the gap having a length from a farthest edge of the gap in one direction to a farthest edge of the gap in an opposite direction.

4. The integrated circuit chip of claim 3, further comprising a metallic structure located between the active region and the gap, the metallic structure having a length of at least the length of the gap.

5. The integrated circuit chip of claim 3, further comprising a metallic structure located between an edge of the integrated circuit chip and the gap, the metallic structure having a length of at least the length of the gap.

6. The integrated circuit chip of claim 3, further comprising a metallic structure located between the active region and the gap, the metallic structure is of a length and position such that each end of the metallic structure extends at least 10 um past each end of the gap.

7. The integrated circuit chip of claim 3, further comprising a metallic structure located between an edge of the integrated circuit and the gap, the metallic structure is of a length and position such that each end of the metallic structure extends at least 10 um past each end of the gap.

8. The integrated circuit chip of claim 4, wherein the metallic structure is positioned at a distance from about 2 um to 5 um from the gap.

9. The integrated circuit chip of claim 5, wherein the metallic structure is positioned at a distance from about 2 um to 5 um from the gap.

* * * * *